United States Patent
Tseng

(10) Patent No.: US 6,268,264 B1
(45) Date of Patent: *Jul. 31, 2001

(54) METHOD OF FORMING SHALLOW TRENCH ISOLATION

(75) Inventor: Horng-Huei Tseng, Hsinchu (TW)

(73) Assignee: Vanguard International Semiconductor Corp., Hsinchu (TW)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 19 days.

(21) Appl. No.: 09/206,186

(22) Filed: Dec. 4, 1998

(51) Int. Cl.$^7$ .................................................. H01L 21/76
(52) U.S. Cl. ...................... 438/424; 438/296; 438/427; 257/397; 257/510
(58) Field of Search .................. 438/424, 427, 438/435, 296; 257/510, 397

(56) References Cited

U.S. PATENT DOCUMENTS

| | | | |
|---|---|---|---|
| 5,733,383 | * | 3/1998 | Fazan et al. ........................ 438/424 |
| 5,801,082 | * | 9/1998 | Tseng ................................. 438/424 |
| 5,817,566 | * | 10/1998 | Jang et al. .......................... 438/424 |
| 5,882,983 | * | 3/1999 | Gardner et al. ..................... 438/424 |
| 5,918,131 | * | 6/2000 | Hsu et al. ........................... 438/296 |
| 5,960,298 | * | 9/1999 | Kim .................................... 438/424 |
| 6,005,279 | * | 12/1999 | Luning ................................ 257/510 |
| 6,017,800 | * | 1/2000 | Sayama et al. ..................... 438/424 |
| 6,054,343 | * | 4/2000 | Ashburn .............................. 438/221 |
| 6,084,276 | * | 7/2000 | Gambino et al. ................... 257/397 |

FOREIGN PATENT DOCUMENTS

| | | | | |
|---|---|---|---|---|
| 04111312A | * | 4/1992 | (JP) | .............................. H01L/21/30 |
| 08097277 | * | 4/1996 | (JP) | .............................. H01L/21/76 |
| 10199875 | * | 7/1998 | (JP) | .............................. H01L/21/76 |
| 344120A | * | 11/1998 | (TW) | ............................. H01L/21/76 |
| 345721 | * | 11/1998 | (TW) | ............................ H01L/21/768 |

OTHER PUBLICATIONS

JD 322100 A Abstracts of Research Disclosure Kenneth Masons Publications, Industrial Opportunites, 1991.*

* cited by examiner

Primary Examiner—Charles Bowers
Assistant Examiner—David S Blum
(74) Attorney, Agent, or Firm—Jiawei Huang; J.C. Patents

(57) ABSTRACT

A method of fabricating a shallow trench isolation. A trench is formed in a substrate. An insulation plug is formed to fill the trench. The trench has an exposed upper portion above the substrate. A silicon spacer is formed on a side wall of the exposed upper portion. The silicon spacer is oxidized into a silicon oxide spacer.

20 Claims, 4 Drawing Sheets

METHOD OF FORMING SHALLOW TRENCH ISOLATION

CROSS-REFERENCE TO RELATED APPLICATION

This application claims priority benefit of Taiwan application Ser. No. 87117381, filed Oct. 21, 1998, the full disclosure of which is incorporated herein by reference.

BACKGROUND OF THE INVENTION

1. Field of the Invention

The invention relates in general to a method of forming an integrated circuit, and more particularly, to a method of forming a shallow trench isolation (STI).

2. Description of the Related Art

In the very advanced fabrication technology of integrated circuits, to reduce the dimensions of devices and to increase the integration are a leading trend and topic for further development. However, as the dimensions of devices shrink the isolation structures between devices have to shrink as well. It is thus to cause a problem and difficulty in fabrication. Isolation structure such as a field oxide formed by local oxidation (LOCOS) has been widely used in the conventional fabrication process. Due to the consequently caused characteristics such as a bird's beak, this technique cannot meet the requirement for high integration. Other structure such as a shallow trench isolation has been used instead of the field oxide layer, especially in sub-half micron fabrication process.

To fabricate a shallow trench isolation, a nitride layer is commonly used as a hard mask layer on a substrate. Using anisotropic etching, a trench is formed in the substrate. An oxide plug is then filled in the trench to form the shallow trench isolation. In the conventional method, it is inevitable that a recess occurs around the edge of the oxide plug to cause a corner effect. In the subsequent process, such as using ion implantation to form a source/drain region of a transistor in the substrate, the implanted charged ions would accumulate in the recess around edge. An abnormal subthreshold current is caused in a channel region of the transistor due to accumulated charges. That is, a kink effect is caused. The corner effect has been further discussed by Geissler, Poth, Lasky, Johnson, and Voldman in the paper "A New Three-Dimensional MOSFET Gate-Induced Drain Leakage Effect in Narrow Deep Submicron Device" published in IEEE IEDM Technical Digest, 1911.

To solve the problem of corner effect, Fazan and Pierre C. disclosed a method for fabricating a shallow trench isolation in U.S. Pat. No. 5,799,383. In this disclosure, after the formation of an oxide plug, an oxide layer is formed to cover the substrate and the oxide plug. Using wet etching, a pad oxide layer previously formed on the substrate is removed. However, it is known that the step of etching back the oxide layer is performed by a dry plasma etching process. Since the materials of the oxide layer and the pad oxide layer are apparently the same, the selectivity between these two layers for dry etching is so low that there is no effective way to control the etching level. As a consequence, the pad oxide layer is consequently removed while etching back the oxide layer. The substrate is very likely to be exposed under a plasma environment to be damaged by the plasma. Moreover, in the subsequently process such as an ion implantation, the substrate is directly exposed to the high energy implanted ions. The substrate is thus further damaged. Therefore, though this technique disclosed here improve the corner effect, the substrate is easily damaged by directly exposed under a plasma or implanted ions.

SUMMARY OF THE INVENTION

It is an object of the invention to provide a method of fabricating a shallow trench isolation. The problem caused by the corner effect are solved, and the substrate is protected from being damaged.

To achieve the above-mentioned objects and advantages, a method of fabricating a shallow trench isolation is provided. A pad oxide layer is formed on a substrate. A hard mask layer is formed on the pad oxide layer. A trench is formed in the substrate and penetrating through the pad oxide and the hard mask layer. The trench is filled with an oxide plug. The hard mask layer is removed, so that the oxide plug has an upper portion protruding out of the substrate. A silicon thin film is formed to cover the oxide plug and the substrate. The silicon thin film is etched back by plasma dry etching to leave a spacer on a side wall of the protruding upper portion of the oxide plug. Using thermal oxidation, the spacer is oxidized into an oxide spacer, so that a shallow trench isolation is formed without the formation of a recess around the edge.

According to the invention, since the silicon thin film and the oxide layer have obviously different etching rates for dry etching, the pad oxide layer can be used as an etching stop for the etching back process without being removed consequently. With the protection of the pad oxide layer, the substrate is not directly under the attack of the etching plasma. In another aspect, with the formation of the spacer, the problems caused by recessed surface around the edge of the shallow trench isolation are eliminated. Furthermore, the pad oxide further protect the substrate from being damaged during the subsequent process such as ion implantation.

Both the foregoing general description and the following detailed description are exemplary and explanatory only and are not restrictive of the invention, as claimed.

DESCRIPTION OF THE PREFERRED EMBODIMENTS

Figure 1A:
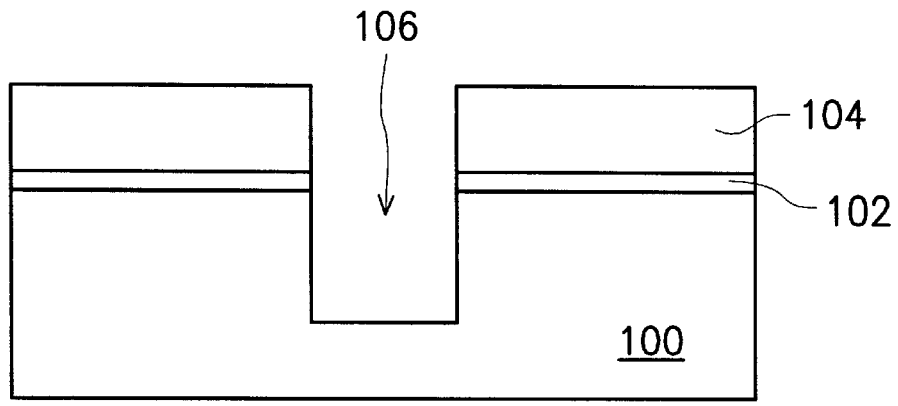
FIGS. 1A to FIG. 1J are cross-sectional views showing a fabrication process for forming a shallow trench isolation in a preferred embodiment according to the invention.

In FIG. 1A, a pad oxide layer 102 is formed on a substrate 100. The pad oxide layer 102 is formed to protect the substrate 100 from being damaged during the subsequent processes and is removed before forming a gate oxide layer. Preferably, the pad oxide layer 102 is formed by chemical vapor deposition (CVD) with a thickness of about 100 Å to 150 Å. A hard mask layer 104, for example, a silicon nitride layer with a thickness of about 1000 Å to 3000 Å, is formed on the pad oxide layer 102. Using photolithography and etching, a part of the hard mask layer 104 is removed to expose a part of the pad oxide layer 100. The exposed pad oxide layer 102 and a part of the underlying substrate 100 are removed to form a trench 106. Typically, the trench 106 is formed with a depth of about 0.2 $\mu$m to 0.8 $\mu$m, preferably about 0.4 $\mu$m. It is to be noted that the actual depth of the trench 106 depends on the dimension of the practical device to be formed.

Figure 1B:
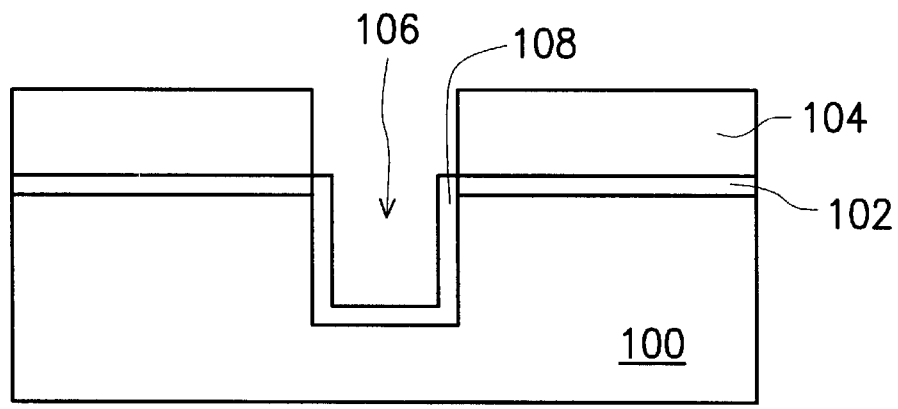

In FIG. 1B, using thermal oxidation, a liner oxide layer 108 is formed along a surface of the substrate 100 exposed by the trench 106. The liner oxide layer 108 has a thickness, for example, of about 150 Å to 200 Å.

Figure 1C:
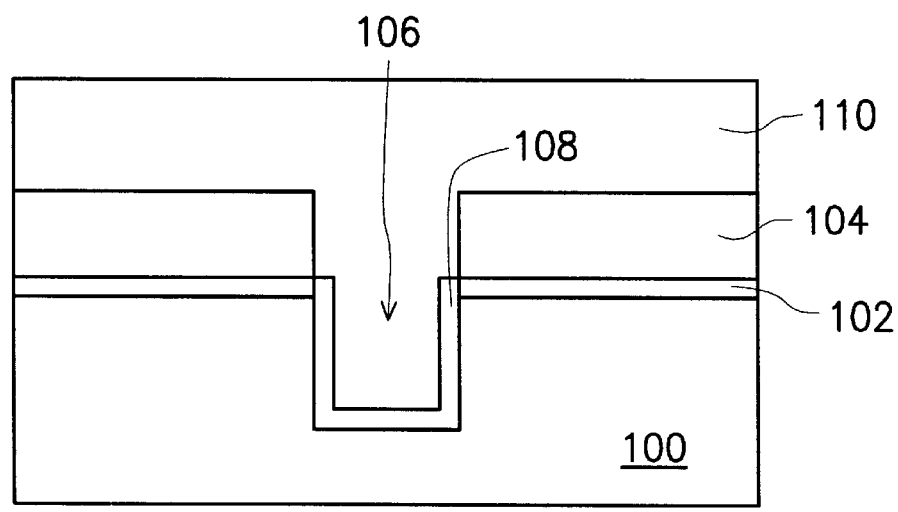

In FIG. 1C, an insulation layer 110, for example, an oxide layer formed by atmosphere pressure CVD, is formed on the hard mask layer 104 to fill the trench 106. The insulation layer 110 has a thickness dependent on the specific depth of the trench 106 and the thickness of other layers such as the hard mask layer 104. Preferably, the thickness of the insulation layer 110 is ranged between 9000 Å to 11000 Å. A densification step is performed under a temperature of about 1000° for about 10 to 30 minutes. A densified structure of the insulation layer 110 is thus obtained.

Figure 1D:
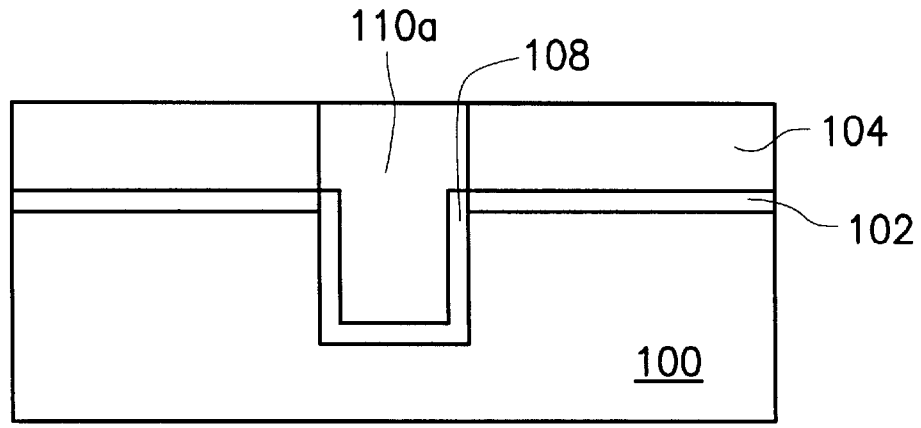

In FIG. 1D, using the hard mask layer 104 as a stop layer, the portion of the insulation layer 110 above the hard mask layer 104 is removed by chemical mechanical polishing to form an insulation plug 110a in the trench 106.

Figure 1E:
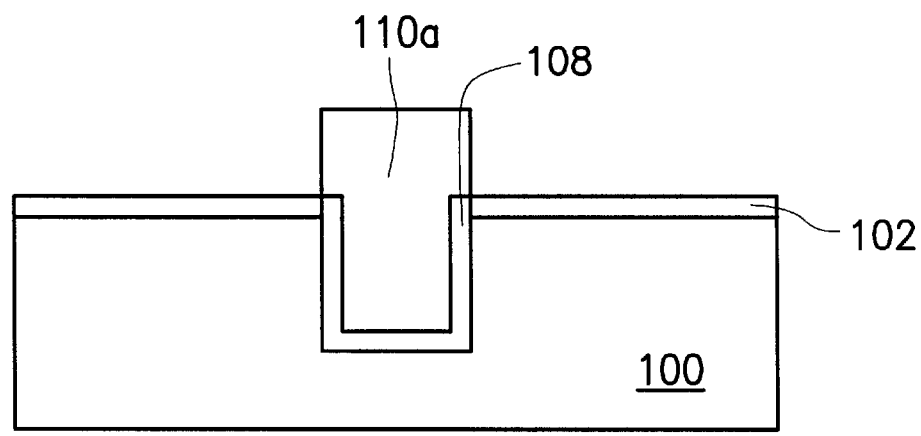

In FIG. 1E, the hard mask layer 104 is removed, for example, using hot phosphoric acid solution, to expose the pad oxide layer 102. As a consequence, the insulation plug 110a has an upper portion outstanding the substrate 100.

Figure 1F:
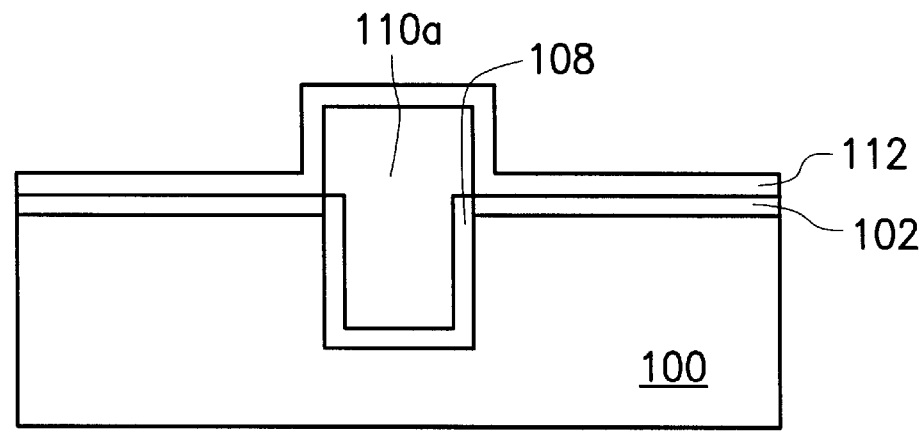

In FIG. 1F, a silicon layer 112, for example, a single crystalline silicon layer, a polysilicon layer, or an amorphous silicon layer with a thickness of about 100 Å to 1000 Å, is formed to cover the insulation plug 110a and the substrate 100.

Figure 1G:
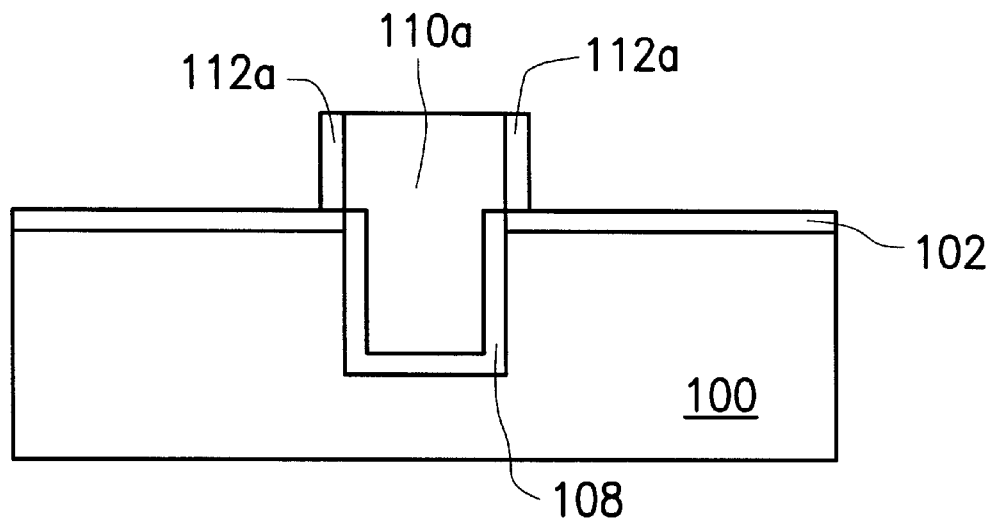

In FIG. 1G, the silicon layer 112 is etched back to form a silicon spacer 112a on a sidewall of the protruded portion of the insulation plug 110a. The method of etch back includes a dry etch such as an electron cyclotron resonance (ECR), reactive ion etching (RIE), and magnetic enhanced RIE. The plasma reactive gas used in the etch back step comprises halogen elements or a mixture of halogen elements and oxygen, for example, gases such as chlorine, bromine, sulfur hexafluoride, oxygen, and hydrogen bromide. Typically, the etching process using one of these reactive gas has a selectivity larger than 20 of the silicon to silicon oxide. Thus, during etching back process, the silicon spacer 112a has an etching speed twenty times larger than that of the pad oxide layer 102. While the pad oxide layer 102 is exposed, the etching process is obviously slowed down, or stopped without etching, or even removing the pad oxide layer 102 to expose the substrate 100 directly under the plasma environment.

Figure 1H:
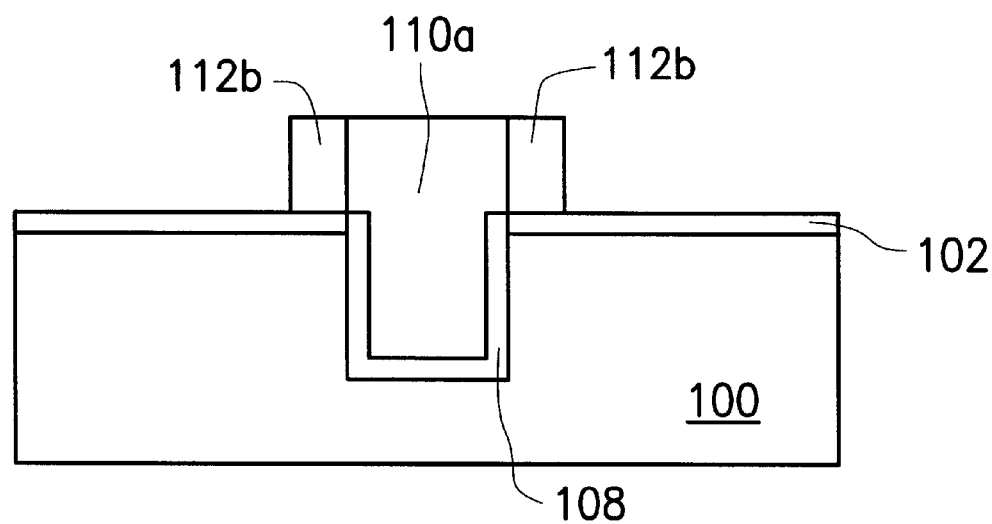

In FIG. 1H, using thermal oxidation, the silicon spacer 112a (shown in FIG. 1G) is transformed into a silicon oxide spacer 112b. The formation of the silicon oxide spacer 112b eliminates the problems caused by the corner effect. The silicon oxide spacer 112b has a thickness about twice the thickness of the silicon spacer 112a. That is, the thickness of the silicon spacer 112a is 0.4 to 0.6 of the silicon oxide spacer 112b.

Figure 1I:
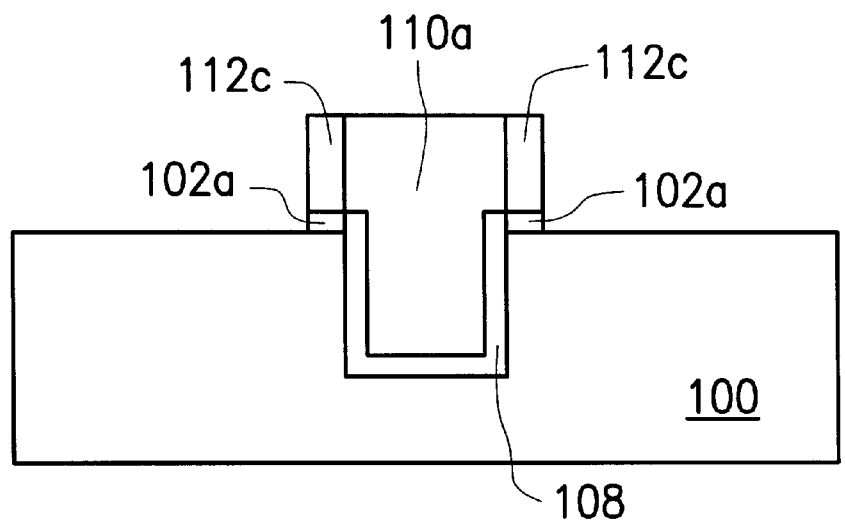

It is often that an ion implantation is performed to adjust the characteristics, for example, the channel effect or the threshold voltage, of a device such as a metal-oxide semiconductor (MOS) formed on the substrate 100 subsequently. The pad oxide layer 102b can thus act as a protection or barrier layer to protect the substrate 100 from being damaged by the implanted ions. In FIG 1I, the pad oxide layer is removed by wet etching or plasma etching. Since the material of the silicon oxide spacer 112b and the pad oxide layer 102 is the same, a part of the silicon oxide spacer 102b is consequently removed and resulted as denoted by 102c.

Figure 1J:
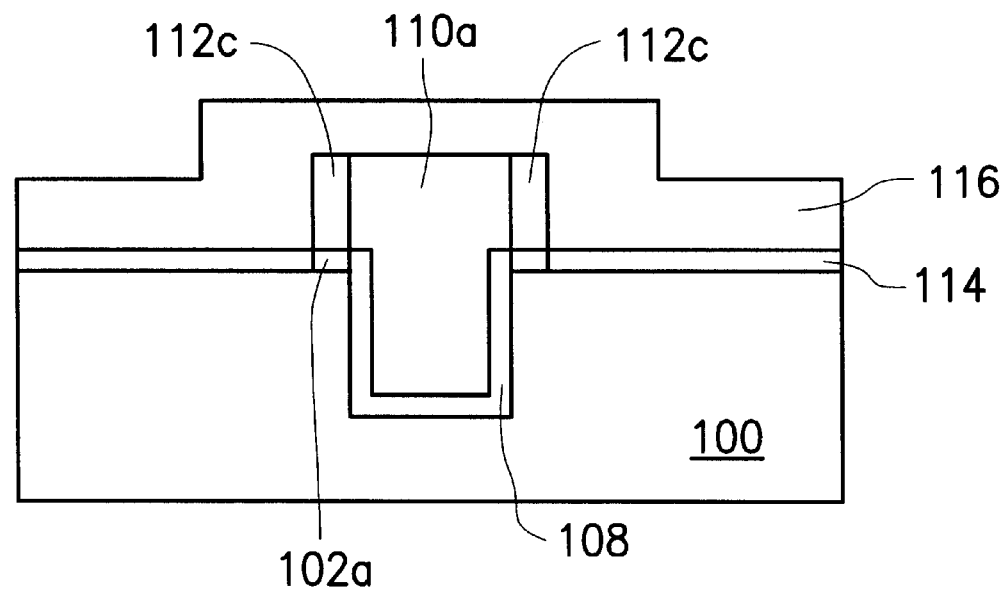

In FIG. 1J, using a prior technique, a gate oxide layer 114 is formed, and a gate material layer 116 is formed on the gate oxide layer 116.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of forming a shallow trench isolation, comprising:

providing a substrate;

forming a pad oxide layer on the substrate;

forming a hard mask layer on the pad oxide layer;

removing a part of the hard mask layer, the pad oxide layer, and the substrate to form a trench in the substrate;

forming a liner oxide along the trench surface;

forming an insulation layer on the hard mask layer to fill the trench;

etching back the insulation layer with the hard mask layer as an etching stop;

removing the hard mask layer without removing the pad oxide layer to form an insulation plug with an upper portion outstanding the substrate that is covered by the pad oxide layer;

forming a silicon layer on the substrate, which is covered by the pad oxide layer, and the insulation plug;

etching back the silicon layer to form a silicon spacer on a side wall of the outstanding upper portion of the insulation plug; and using thermal oxidation to transform the silicon spacer into a silicon oxide spacer;

after the silicon oxide spacer is formed, removing the pad oxide layer; and after the pad oxide layer is removed, forming a gate oxide layer on the substrate.

2. The method according to claim 1, wherein the hard mask layer comprises a silicon nitride layer.

3. The method according to claim 1, wherein the hard mask layer has a thickness of about 1000 Å to 3000 Å.

4. The method according to claim 1, wherein the trench has a depth of about 0.2 µm to 0.8 µm.

5. The method according to claim 4, wherein the trench has a depth of about 0.4 µm.

6. The method according to claim 1, wherein the insulation layer includes an silicon oxide layer.

7. The method according to claim 1, wherein the insulation layer has a thickness of about 9000 Å to 11000 Å.

8. The method according to claim 1, wherein the silicon layer comprises a single crystalline silicone layer.

9. The method according to claim 1, wherein the silicon layer comprises a polysilicon layer.

10. The method according to claim 1, wherein the silicon layer comprises an amorphous silicon layer.

11. The method according to claim 1, wherein the silicon layer has a thickness of about 100 Å to 1000 Å.

12. The method according to claim 1, comprising further a step of densification after forming the insulation layer.

13. The method according to claim 1, wherein the step of etching back the silicon layer comprises magnetic enhanced reactive ion etching.

14. The method according to claim 1, wherein the step of etching back the silicon layer comprises electron cyclotron plasma etching.

15. The method according to claim 1, wherein the step of etching back the silicon layer comprises reactive ion etching.

16. The method according to claim 1, comprising further a step of ion implantation before removing the pad oxide layer.

17. A method of fabricating a shallow trench isolation, comprising:

provided a substrate having a pad oxide layer formed thereon;

forming a hard mask layer on the pad oxide layer;

forming a trench penetrating through the hard mask layer and the pad oxide layer to expose a portion of the substrate;

forming an insulation plug in the trench;

removing the hard mask layer without removing the pad oxide layer, so that the insulation plug having a protruding upper portion above the substrate that is covered by the pad oxide layer;

forming a silicon spacer on a side wall of the protruding upper portion; and oxidizing the silicon spacer;

removing the pad oxide layer after the silicon spacer is oxidized; and forming a gate oxide layer on the substrate after the pad oxide layer is removed.

18. The method according to claim 17, comprising further a step of forming a liner oxide layer along the trench surface before forming the insulation plug.

19. The method according to claim 17, wherein the silicon layer has a thickness of about 100 Å to 1000 Å.

20. The method according to claim 18, comprising further a step of ion implantation before removing the pad oxide layer.

* * * * *